(12) United States Patent
Robinson et al.

(10) Patent No.: US 10,438,808 B2
(45) Date of Patent: Oct. 8, 2019

(54) HARD-MASK COMPOSITION

(71) Applicants: Alex Philip Graham Robinson, Birmingham (GB); Thomas Lada, Somerville, MA (US); John L. Roth, Cohasset, MA (US); Alan G. Brown, Malvern (GB); Andreas Frommhold, Anger (DE); Edward A. Jackson, Franklin, MA (US)

(72) Inventors: Alex Philip Graham Robinson, Birmingham (GB); Thomas Lada, Somerville, MA (US); John L. Roth, Cohasset, MA (US); Alan G. Brown, Malvern (GB); Andreas Frommhold, Anger (DE); Edward A. Jackson, Franklin, MA (US)

(73) Assignee: IRRESISTIBLE MATERIALS, LTD, Birmingham (GB)

( * ) Notice: Subject to any disclaimer, the term of this patent is extended or adjusted under 35 U.S.C. 154(b) by 0 days.

(21) Appl. No.: 15/164,801

(22) Filed: May 25, 2016

(65) Prior Publication Data

US 2017/0345669 A1    Nov. 30, 2017

(51) Int. Cl.

| | |
|---|---|
| *H01L 21/308* | (2006.01) |
| *C08J 3/24* | (2006.01) |
| *C08J 3/28* | (2006.01) |
| *C09D 4/06* | (2006.01) |
| *C09D 167/02* | (2006.01) |
| *H01L 21/3065* | (2006.01) |
| *C09C 1/44* | (2006.01) |

(Continued)

(52) U.S. Cl.
CPC ............ *H01L 21/3081* (2013.01); *C08J 3/24* (2013.01); *C08J 3/28* (2013.01); *C08K 3/045* (2017.05); *C09C 1/44* (2013.01); *C09D 4/06* (2013.01); *C09D 163/00* (2013.01); *H01L 21/02118* (2013.01); *H01L 21/02282* (2013.01); *H01L 21/3065* (2013.01); *H01L 21/3085* (2013.01); *H01L 21/3086* (2013.01); *C08J 2363/00* (2013.01)

(58) Field of Classification Search
CPC .. C08J 3/24; C08J 3/28; C08J 2363/00; H01L 21/3081; H01L 21/3065; H01L 21/3085; H01L 21/3086; H01L 21/02118; H01L 21/02282; C09D 4/06; C09D 163/00; C09C 1/44; C08K 3/045
USPC ........................................................ 523/400
See application file for complete search history.

(56) References Cited

U.S. PATENT DOCUMENTS

| | | | |
|---|---|---|---|
| 2012/0004476 A1* | 1/2012 | Yoon ...................... | B82Y 10/00 585/26 |
| 2012/0045900 A1* | 2/2012 | Watanabe ............. | C07C 69/753 438/703 |

(Continued)

FOREIGN PATENT DOCUMENTS

JP          2007199653 A   *   8/2007   ................ G03F 7/11

OTHER PUBLICATIONS

Hatakeyama et al., JP 2007-199653 A machine translation in English, Aug. 2007 (Year: 2007).*

*Primary Examiner* — David T Karst
(74) *Attorney, Agent, or Firm* — The Patent Practice of Szmanda & Shelnut

(57) ABSTRACT

Disclosed and claimed herein is a composition for forming a spin-on hard-mask, having a fullerene derivative and a crosslinking agent. Further disclosed is a process for forming a hard-mask.

8 Claims, 7 Drawing Sheets

(51) Int. Cl.
  *H01L 21/02*   (2006.01)
  *C08K 3/04*    (2006.01)
  *C09D 163/00*  (2006.01)

(56) References Cited

U.S. PATENT DOCUMENTS

| | | | |
|---|---|---|---|
| 2014/0312281 A1* | 10/2014 | Jackson | H01L 51/0047 |
| | | | 252/500 |
| 2015/0010703 A1* | 1/2015 | Frommhold | C09C 1/44 |
| | | | 427/240 |
| 2015/0069304 A1* | 3/2015 | Blouin | C07C 43/215 |
| | | | 252/500 |

* cited by examiner

HARD-MASK COMPOSITION

FIELD OF THE INVENTION

The present application for patent is in the field of imaging for semiconductor manufacturing and more specifically is in the field of etch masking using spin-on hard-mask formulations.

BACKGROUND

Minimum feature sizes of semiconductor devices continue to shrink to enable increasing device densities. One method of achieving such high density patterning is to use thin photoresist films to mitigate problems such pattern collapse of high aspect-ratio resist features upon development. One possible solution to the problem involves using a high-resolution, high sensitivity and high etch durability fullerene resist. However, even though the aspect ratios produced by such resists may be as high as 5:1, the overall etch depth is limited significantly by the usable resist thickness.

A multilayer hard-mask stack can allow a further increase of the aspect ratio of the etched image. Such methods may use a thick amorphous carbon, deposited in vacuo by chemical vapor deposition, which is then coated with a thin-silicon rich layer. A thin photoresist film is then sufficient to pattern the silicon-rich layer; thus avoiding pattern collapse. The silicon-rich layer is in-turn used as a hard-mask to pattern the carbon, giving a high aspect ratio carbon pattern suitable for providing a mask for etching the silicon wafer. By alternating from silicon to carbon rich materials and vice versa optimization of the overall etch selectivities of various substrates can be accomplished.

In recent years, methanofullerene materials have been used in hard-mask formulations. For example, Frommhold et al., in International Patent Application No. WO1013/117908 A1, describe a hard-mask material comprising a methanofullerene and a cross-linker, However, there continues to be a demand for hard-mask materials that exhibit reduced swelling and comingling when in contact with resist solvents, increased carbon content, lower etching resistance, and higher thermal stability relative to previous formulations. These improvements are exhibited by the materials described herein.

DETAILED DESCRIPTION

Figure 1:
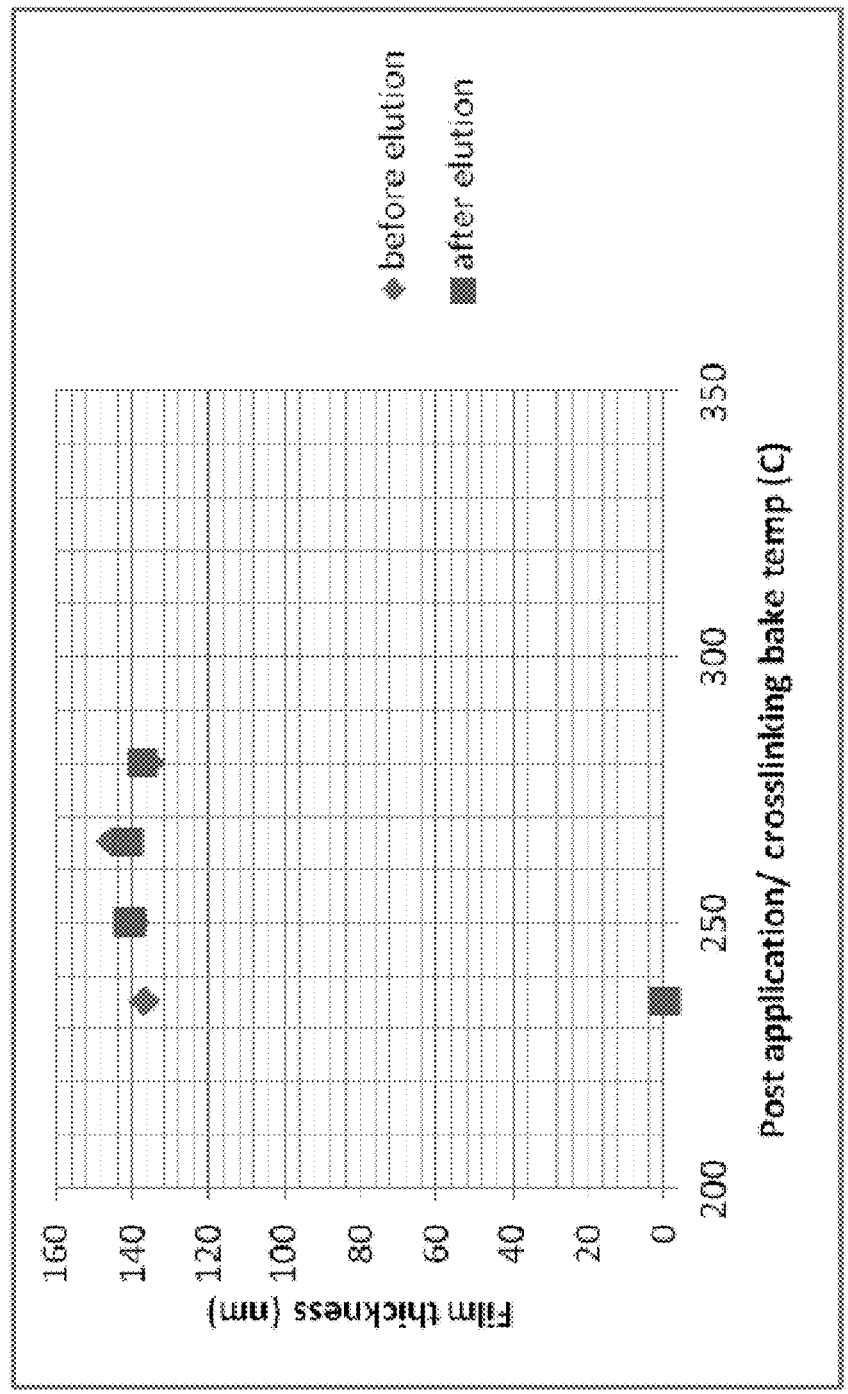
FIG. 1 illustrates film thickness retention after treatment with chlorobenzene for the formulation of Example 1.

As used herein, the conjunction "and" is intended to be inclusive and the conjunction "or" is not intended to be exclusive unless otherwise indicated or required by context. For example, the phrase "or, alternatively" is intended to be exclusive. When used in the context of alternative chemical substituents on a molecule, the conjunction "or" is intended to be exclusive. As used, herein, the article "a" is understood to mean one or more. As used herein, an "alicyclic" compound is an organic compound or substituent that is both aliphatic and cyclic. Alicyclic compounds may contain one or more all-carbon rings which may be either saturated or unsaturated and portions may or may not have aromatic character. Alicyclic compounds may or may not have aliphatic side chains attached. As used herein, the term "exemplary" is used to indicate an example and is not necessarily used to indicate preference. As used herein, the term "exohedral ring" is understood to be a ring structure fused to the outside of a fullerene at two adjacent carbon atoms (see the structure in (IX)). The number of members in the exohedral ring includes the two carbon atoms in the fullerene. As used herein, a non-bridged ring does not comprise a bridge having one or more atoms between two non adjacent atoms, such as, for example, might be seen in a norbornane ring.

Disclosed herein is a hard-mask composition, comprising: one or more fullerene derivatives having one or more exohedral rings, expressed by the general formula (I):

(I)

wherein n is an integer from 1 to 12, Q, is a fullerene having 60, 70, 76, 78, 80, 82, 84, 86, 90, 92, 94, or 96 carbon atoms, P comprises a single non bridged ring having 4 to 6 members, or two or more non bridged fused rings, each having 4 to 12 members; and further comprising a cross-linking agent comprising two or more thermally or catalytically reactive groups, and wherein both the exohedral first ring, P, and the second ring may optionally contain at least one heteroatom.

Disclosed herein is a hard-mask composition, comprising: (a) one or more fullerene derivatives, expressed by the general formula, (II),

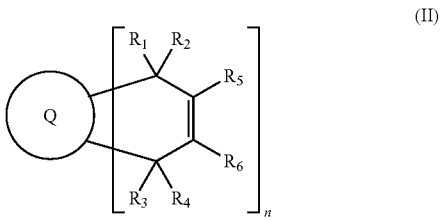

(II)

wherein n is an integer from 1 to 12, Q, the number of carbon atoms in the fullerene, is 60, 70, 76, 78, 80, 82, 84, 86, 90, 92, 94, or 96, $R_1'$ $R_2$, $R_3$, and $R_4$ independently represent a substituent comprising an ester, an alcohol, a phenol, an amine, an amide, an imide, or a carboxylic acid, a hydrogen, a halogen, a $C_6$-$C_{20}$ aryl group, a $C_1$-$C_{20}$ alkyl group, or a $C_1$-$C_{20}$ alkaline group, $R_5$ and $R_6$ together comprise a non bridged ring structure or, in the alternative, independently comprise a substituent comprising an ester, an alcohol, a phenol, an amine, an amide, an imide, or a carboxylic acid, a hydrogen, a halogen, a $C_6$-$C_{20}$ aryl group, a $C_1$-$C_{20}$ alkyl group, or a $C_1$-$C_{20}$ alkaline group; and (b) a crosslinking agent comprising two or more thermally or catalytically reactive groups.

Further disclosed herein is a composition described supra, wherein the one or more fullerene derivatives is expressed by formula, (III),

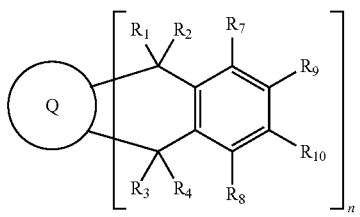

wherein $R_7$ and $R_8$ independently represent a substituent comprising an ester, an alcohol, a phenol, an amine, an amide, an imide, or a carboxylic acid, a hydrogen, a halogen, a $C_6$-$C_{20}$ aryl group, a $C_1$-$C_{20}$ alkyl group, or a $C_1$-$C_{20}$ alkaline group, $R_9$ and $R_{10}$ together comprise a non bridged ring structure or, in the alternative, independently comprise a substituent comprising an ester, an alcohol, a phenol, an amine, an amide, an imide, or a carboxylic acid, a hydrogen, a halogen, a $C_6$-$C_{20}$ aryl group, a $C_1$-$C_{20}$ alkyl group, or a $C_1$-$C_{20}$ alkaline group. As with the composition just above, n is an integer from 1 to 6, Q, the number of carbon atoms in the fullerene, is 60, 70, 76, 78, 80, 82, 84, 86, 90, 92, 94, or 96 carbon atoms.

Still further disclosed herein is a hard-mask composition, comprising: (a) one or more fullerene derivatives, formed as the product of a cycloaddition reaction between the fullerene and a diene, which may be generated by a diene precursor, characterized as

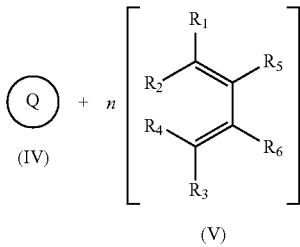

wherein (IV) is a fullerene, V represents a diene or its precursor, n is an integer from 1 to 20, Q, the number of carbon atoms in the fullerene, is 60, 70, 76, 78, 80, 82, 84, 86, 90, 92, 94, or 96, $R_1$' $R_2$, $R_3$, and $R_4$ independently represent a substituent comprising an ester, an alcohol, a phenol, an amine, an amide, an imide, or a carboxylic acid, a hydrogen, a halogen, a $C_6$-$C_{20}$ aryl group, a $C_1$-$C_{20}$ alkyl group, or a $C_1$-$C_{20}$ alkaline group, $R_5$ and $R_6$ together comprise a non bridged ring structure or, in the alternative, independently comprise a substituent comprising an ester, an alcohol, a phenol, an amine, an amide, an imide, or a carboxylic acid, a hydrogen, a halogen, a $C_6$-$C_{20}$ aryl group, a $C_1$-$C_{20}$ alkyl group, or a $C_1$-$C_{20}$ alkaline group; and (b) a crosslinking agent comprising two or more thermally or catalytically reactive groups.

Further disclosed herein is a composition, wherein the cycloaddition reaction between the fullerene and a diene or a diene precursor is characterized as

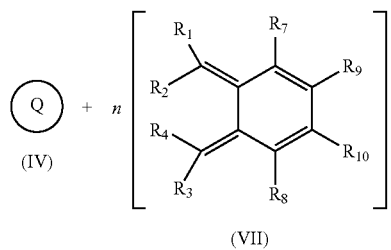

wherein (VI) is a fullerene, (VII) represents a diene or its precursor, $R_7$ and $R_8$ independently represent a substituent comprising an ester, an alcohol, a phenol, an amine, an amide, an imide, or a carboxylic acid, a hydrogen, a halogen, a $C_6$-$C_{20}$ aryl group, a $C_1$-$C_{20}$ alkyl group, or a $C_1$-$C_{20}$ alkaline group, $R_9$ and $R_{10}$ together comprise a non bridged ring structure or, in the alternative, independently comprise a substituent comprising an ester, an alcohol, a phenol, an amine, an amide, an imide, or a carboxylic acid, a hydrogen, a halogen, a $C_6$-$C_{20}$ aryl group, a $C_1$-$C_{20}$ alkyl group, or a $C_1$-$C_{20}$ alkaline group. As with the composition, supra, n is an integer from 1 to 20, Q, the number of carbon atoms in the fullerene, is 60, 70, 76, 78, 80, 82, 84, 86, 90, 92, 94, or 96.

Various embodiments will become apparent based on the subject matter disclosed herein. It is contemplated that the disclosed compositions and processes may advantageously be used in any reasonable combination. For example, a formulation having an epoxy resin might also contain an aminoplast crosslinker such as a methylolmethyl glycoluril resin or a methylolmethyl melamine resin. In addition, a given formulation can contain a distribution of substitutions and substitution patterns on a fullerene without departing from the intended scope of the claims. Moreover, a given formulation can comprise a distribution of substitutions and substitution patterns on fullerenes having different numbers of carbon atoms, without departing from the intended scope of the claims. For example, a formulation may comprise various fullerene allotropes, such as $C_{60}$, $C_{70}$, $C_{76}$, $C_{78}$, $C_{84}$, $C_{86}$, $C_{90}$, $C_{92}$, $C_{94}$, $C_{96}$, and $C_{98}$, each of which may be substituted with 0 to 12 exohedral rings. As another example a formulation may comprise a variety of exohedrally substituted and unsubstituted fullerene allotropes, wherein the fullerenes before substitution are $C_{60}$, $C_{70}$, $C_{76}$, $C_{78}$, $C_{84}$, $C_{86}$, $C_{90}$, $C_{92}$, $C_{94}$, and $C_{96}$, and at least some of the fullerene allotropes are substituted with 0 to 6 exohedral ring substituents. As another example a formulation may comprise a variety of exohedrally substituted and unsubstituted fullerene allotropes, wherein the fullerenes before substitution are $C_{60}$, and $C_{70}$, and at least some of the fullerene allotropes are substituted with 1 to 20 exohedral ring substituents and some of the fullerene allotropes are unsubstituted.

The general formulae (I), (II), (III), (IV) and (VI) are representations of substituted or unsubstituted fullerene derivatives (as the case may be) having 1-20 substituent groups when substituted. Fullerenes can have different allotropes, including, without limitation, $C_{20}$, $C_{28}$, $C_{36}$, $C_{50}$, $C_{60}$, $C_{70}$, $C_{76}$, $C_{78}$, $C_{80}$, $C_{82}$, $C_{84}$, $C_{86}$, $C_{90}$, $C_{92}$, $C_{94}$, $C_{96}$, and $C_{98}$, some of which are shown in (VII), indicating the cage structure but not the bonding. In some cases, different allotropes may have the same number of carbon atoms. For closed structures Euler's polyhedron formula applies, V−E+F=2, where V, E, F are the numbers of vertices (carbon atoms), edges, and faces). If there are 12 pentagons in a fullerene, it follows that there are V/2−10 hexagons. It is understood that fullerene derivatives include all fullerene allotropes having the exohedral substituents described herein.
(VIII)
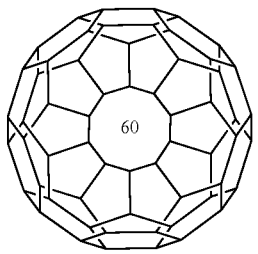
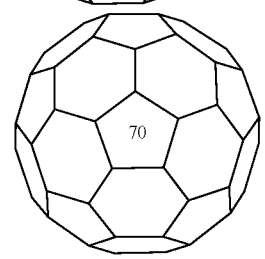
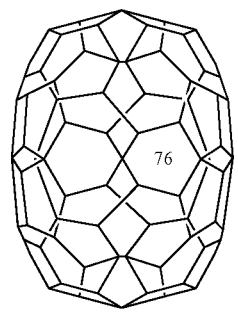
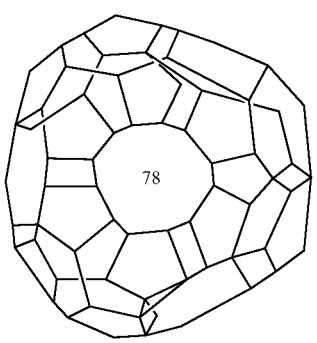
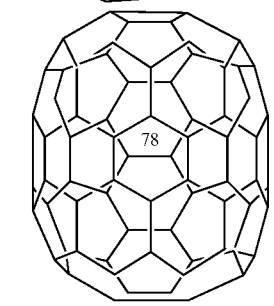
-continued
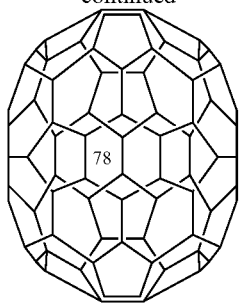
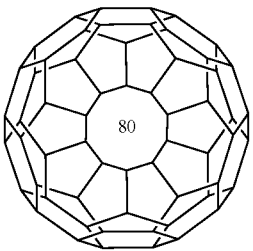
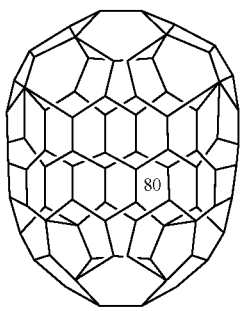
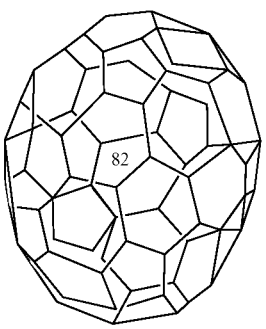
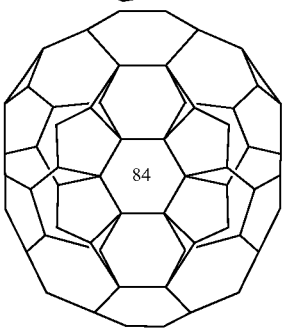

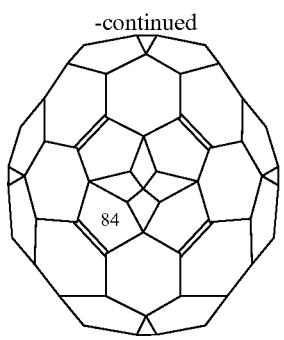

Cycloaddition reactions usually occur as the addition of one unsaturated entity to another to give a cyclic product in which, in most cases, all atoms are conserved in the final product. The two (or more) entities may reside on a single molecule or on multiple molecules. Without intending to be bound by theory, it is believed that the addition reaction can be explained by assuming that the flow of electron density takes place from the highest occupied molecular orbital (HOMO) of one entity to the lowest unoccupied molecular orbital (LUMO) of the other entity.

In accordance with the subject matter disclosed herein, fullerenes may be substituted via cycloaddition reactions across double bonds by a diene or analogous group to form a ring structure that utilizes two or more atoms on the fullerene. For example, in one embodiment, a diene or a hetero-analog thereof can add across a double bond on the fullerene via a cycloaddition reaction, to form a bridge across a pair of vertices wherein two 6-membered rings meet to form a so-called [6, 6] bridge as shown in (IX) (back carbon atoms on the fullerene are not shown). R and R' are substituents such as those described supra. In another embodiment, [6, 5] substitution in the vertices between a 6-membered-ring and a 5-membered-ring by the diene group or diene precursor group may occur. Synthesis techniques for cycloadditions of this kind may be found in Hirsch, et al., "Fullerenes: Chemistry and Reactions," WILEY-VCH Verlag GmbH and Co., Weinheim, Chapter 4, (2005), Diederich et al., Science, 271, 317, (1996), Filippone et al., "Exohedral Fullerenes," Encyclopedia of Polymeric Nanomaterials, Springer-Verlag, Berlin, Heidelberg, pp. 1-16, (2014), and Yang et al., J. Org. Chem., 78, 1163, (2013).

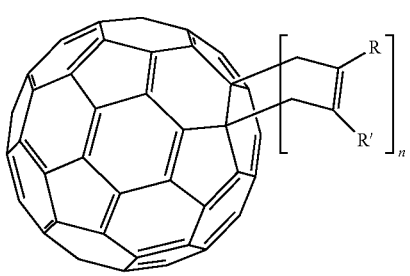

Products such as those represented by (IX) may be obtained directly by [4+2] cycloaddition reactions with dienes or via cycloaddition reactions with diene precursors. For example, Yang et al., Id. at p. 1163 report a blend of products, formed in the presence of amines, phosphines and the like, according to the following reaction, depending on conditions:

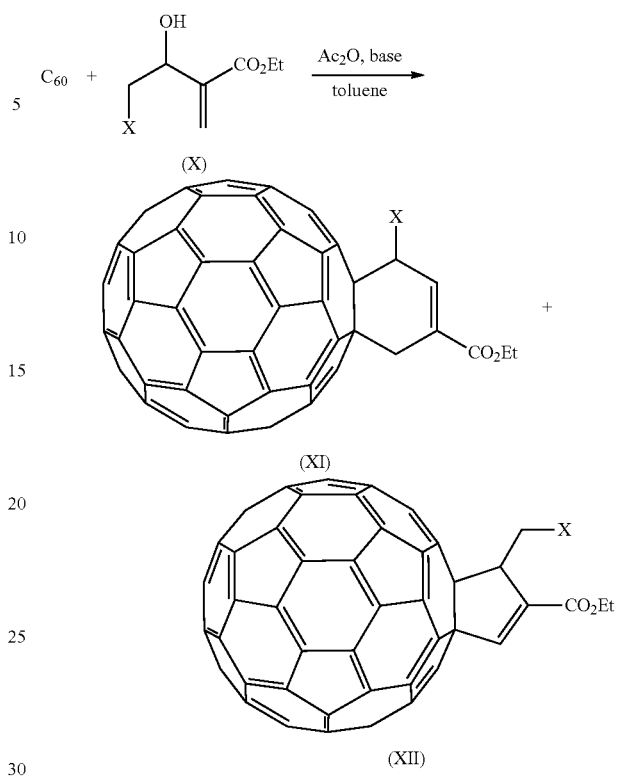

$C_{60}$ is a fullerene, (X) is a diene precursor, (XI) is the product of a [4+2] cycloaddition reaction and (XII) is the product of a [3+2] cycloadditions reaction. Without intending to be bound by theory, it is believed that the two products are obtained via different intermediates. For example, production of the diene intermediate via a single elimination reaction may lead to a [4+2] cycloaddition, wherein the diene precursors may comprise hydroxy groups, as shown in (X), which are believed to be lost by single elimination reactions such as dehydrohalogenation, dehydration and the like; thus forming a diene reactant. In addition to hydroxy groups, other groups may afford sufficient reactivity. These groups, herein denoted as leaving groups, may include, without limitation, carboxylic acid esters of hydroxy groups, sulfonic acid esters, phosphonic acid esters, alkyl, tert-alkyl, and alk-aryl carboxylate esters, halogens, cyanide, isocyanide, cyanate, isocyanate, thiocyanate, isothiocyanate, hypothiocyanite, selenocyanate, azide, trinitromethanide, and tricyanomethanide and the like.

In addition to single elimination reactions, double or multiple elimination reactions may be used to generate a stable or transient diene. For example, a variety of 1,2-bis (halomethyl) compounds such as 1,2-bis(bromomethyl) benzene, substituted 1,2-bis(bromomethyl) benzene, and the like may form dienes in situ, by reacting with KI and a phase transfer catalyst, followed by single or multiple Diels Alder reactions with fullerenes, usually on [6,6] sides but possibly at [6,5] sides, giving compounds such as (IX). Fullerenes of different carbon atom number undergo similar reactions. Phase transfer catalysts such as crown ethers, for example, 1,4,7,10,13,16-hexaoxacyclooctadecane (18 Crown-6), or quaternary ammonium salts, for example, $(bu)_4NI$ may be used to promote the reaction. Such reactions are described in Taylor, "Lecture Notes On Fullerene Chemistry: A Handbook For Chemists," Imperial College Press, London, pp. 177 ff., (1999) and Langa, et al., "Fullerenes: Principles and Applications," RSCPublishing, Cambridge, pp. 21 ff., (2007). In addition to substituted halogens, there may be an advantage to using one or more of the other leaving groups described above. Using such techniques, one may form m,m+1-dimethylene-m,m+1-dihydro-W aromatic and heteroaromatic compounds, where m denotes the location of a methylene group. Examples of W include, without limitation, benzene, naphthalene, thiophene, pyrrole (1H, and 2H), pyrazole, triazole, thiadiazole, oxadiazole, imidazole, pyridine, and the like. Examplary dienes which may be formed in this way include without limitation, 2,3-dimethylene-2,3-dihydrobenzene, 2,3-dimethylene-2,3-dihydronaphthalene, 2,3-dimethylene-2,3-dihydrophenanthrene, 2,3-dimethylene-2,3-dihydropyridine, and the like.

Other reaction schemes may be useful in forming useful dienes. For example, 1,4-dihydrophthalazine may used to form 2,3-dimethylene-2,3-dihydrobenzene by thermally eliminating $N_2$. Other examples of diene precursors include, without limitation, 1,3-dihydro-2-benzothiophene 2,2-dioxide, 1,4-dihydro-2,3-benzoxathiine 3-oxide. The latter two precursors form 2,3-dimethylene-2,3-dihydrobenzene by eliminating $SO_2$ as a gas or nascent gas. Examplary dienes which may be formed in this way include without limitation, 2,3-dimethylene-2,3-dihydrobenzene, 2,3-dimethylene-2,3-dihydronaphthalene, 2,3-dimethylene-2,3-dihydrophenanthrene, 2,3-dimethylene-2,3-dihydropyridine, and the like. Such reactions are described in Chung, et al., J. Chem. Soc., Chem Commun., (1995), 2537, and Beer, et al., J. Mater. Chem., (1997), 7, 1327. Using such techniques, one may form m,m+1-dimethylene-m,m+1-dihydro-W aromatic and heteroaromatic compounds, where m denotes the location of a methylene group. Examples of W include, without limitation, benzene, naphthalene, thiophene, pyrrole (1H, and 2H), pyrazole, triazole, thiadiazole, oxadiazole, imidazole, pyridine, and the like. Examplary dienes which may be formed in this way include without limitation, 2,3-dimethylene-2,3-dihydrobenzene, 2,3-dimethylene-2,3-dihydronaphthalene, 2,3-dimethylene-2,3-dihydrophenanthrene, 2,3-dimethylene-2,3-dihydropyridine, and the like.

In addition to cycloaddition reactions with dienes, usually, [4+2] cycloaddition reactions, [3+2] cycloaddition reactions may yield singly and multiply substituted thermal products via ylide intermediates and dipolar compounds, using pnicogen compounds such as diazides, azomethines, nitrones, amines, phosphines, arsines, stibines, and isoelectronic or electronically equivalent analogs thereof. Such reactions may produce 5-membered homocyclic and heterocyclic rings. Exemplary compounds used for forming ylides include, without limitation, aryl phosphines, tri-n-alkyl phosphines, tri-isoalkyl phosphines, phosphines comprising mixed substituents such as aryl-di-isoalkyl phosphine and the like. Such reactions are known in the art. Details may be found in Prato et al., J. Am. Chem. Soc., (1993), 115, 1594, Yang, et al., Id. at 1163, ff., Coldham et al., Chem. Rev., (2005), 105, 2765.

Photochemical [2+2] cycloaddition reactions with olefins may also be carried out resulting in singly and multiply substituted four-membered rings at the [6,6] position, and, possibly, the [6,5] position of the fullerene. A wide variety of solvents can be used to carry out the cycloaddition reaction, provided they are degassed to minimize reactions with ambient oxygen. Solvents or cosolvents such as acetone may be useful as triplet sensitizers. Reaction temperature may influence regioselectivity and stereoselectivity. It is usually beneficial to select the excitation wavelength so that the products do not absorb significantly. Suitable olefins include enones, ethylene, substituted ethylenes, acrylates, methacryaltes and the like.

It should be noted that cycloaddition reactions may produce products having a variety of substitutions on the fullerene with various n values and a variety of different substitution patterns for each n value when n>1. A blend of such materials does not depart from the scope of the invention and may offer the advantage of enhanced solubility and a reduced propensity for crystallization.

In accordance with the subject matter disclosed herein, the crosslinking agent may be chosen from an epoxy phenolic novolak resin, an epoxy cresylic novolak resin, an epoxy bisphenol A resin, an expoxy bisphenol novolak resin, an alkylolmethyl melamine resin, an alkylolmethyl glycoluril resin, an alkylolmethyl guanamine resin, an alkylomethyl Benzo-Guanamine resin, a glycosyl urea resin, or an isocyanate (alkyd) resin.

Suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins, BEETLE™ 60, 65 and 80, also available from Cytec, West Paterson, N.J. A large number of similar amine-based or amidoplast compounds are commercially available from various suppliers. Epoxy phenolic and cresylic novolak resins are shown in (IV), wherein X may be H, $CH_3$ and n may be 0-20. Epoxy bisphenol A resins are shown in an idealized structure (V), wherein n may be 0-20. Epoxy bisphenol Z resins are shown in an idealized structure (VI), wherein n may be 0-20. Similar "epoxy bisphenol" crosslinking agents are contemplated. For example, resins based on the diglycidyl ethers of 1,1-bis(4-hydroxyphenyl)-1-phenyl-ethane, 2,2-bis(4-hydroxyphenyl)hexafluoropropane, 2,2-bis(4-hydroxyphenyl)butane, bis-(4-hydroxyphenyl)diphenylmethane, 2,2-bis(3-methyl-4-hydroxyphenyl)propane, bis(4-hydroxyphenyl)-2,2-dichlorethylene, 1,1-bis(4-hydroxyphenyl)ethane, bis(4-hydroxydiphenyl)methane, 2,2-bis(4-hydroxy-3-isopropyl-phenyl)propane, 1,3-bis(2-(4-hydroxyphenyl)-2-propyl)benzene, bis(4-hydroxyphenyl)sulfone, 1,4-bis(2-(4-hydroxyphenyl)-2-propyl)benzene, 5,5'-(1-methylethyliden)-bis[1,1'-(bisphenyl)-2-ol] propane, 1,1-Bis(4-hydroyphenyl)-3,3,5-trimethylcyclohexane, 4,4'-(9H-fluorene-9,9-diyl)dianiline, and combinations with any of the foregoing may be used.

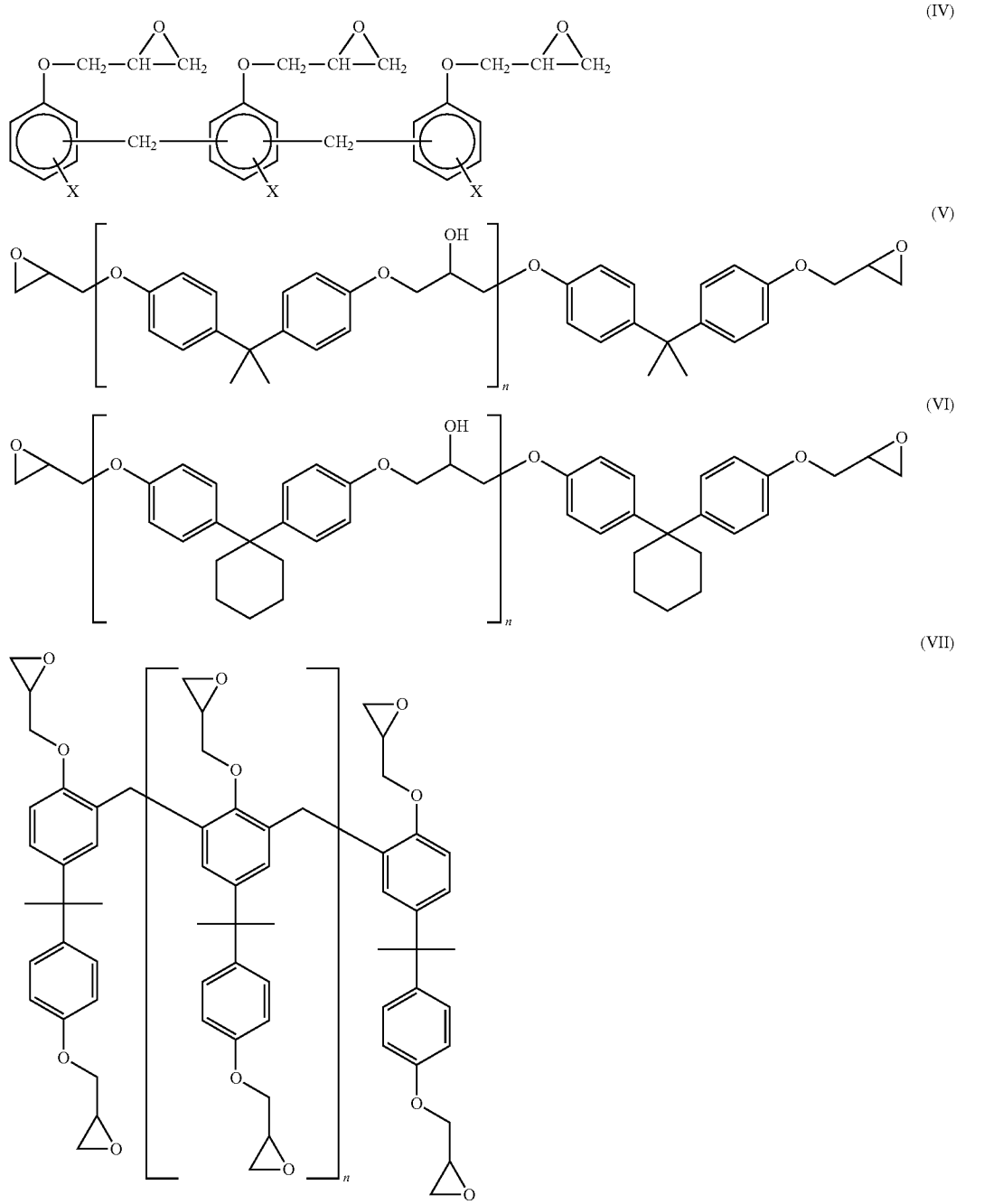

In accordance with the subject matter disclosed herein, suitable thermal acid generators may include alkyl esters of organic sulfonic acids, alicyclic esters of organic sulfonic acids, amine salts of organic sulfonic acids, 2-nitrobenzyl esters of organic sulfonic acids, 4-nitrobenzyl esters of organic sulfonic acids, benzoin esters of organic sulfonic acids, β-hydroxyalkyl esters of organic sulfonic acids, β-hydroxycycloalkyl esters of organic sulfonic acids, triaryl sulfonium salts of organic sulfonic acids, alkyl diaryl sulfonium salts of organic sulfonic acids, dialkyl aryl sulfonium salts of organic sulfonic acids, trialkyl sulfonium salts of organic sulfonic acids, diaryl iodonium salts of organic sulfonic acids, alkyl aryl sulfonium salts of organic sulfonic acids, or ammonium salts of tris(organosulfonyl) methides.

Onium salts comprise cations and anions. Exemplary cations of onium salts include triaryl sulfonium, alkyl diaryl sulfonium, dialkyl aryl sulfonium, trialkyl sulfonium, diaryl iodonium, alkyl aryl iodonium, dialkyl iodonium, triaryl selenonium, alkyl diaryl selenonium, dialkyl aryl selenonium, trialkyl selenonium. Without limitation, specific examples of cations in onium salts include triphenyl sulfonium, tri(p-tolyl) sulfonium, 1,4-phenylenebis(diphenylsulfonium) (having a charge of +2), diphenyliodonium, and bis(4-tert-butylphenyl)iodonium.

Further, without limitation, exemplary anions in onium salts include the halides, $PF_6^-$, $AsF_6^-$, $SbF_6^-$, $SbCl_6^-$, and $BF_4^-$. In addition, without limitation, anions based on oxo-acids may be used. Among these are $C_1$-$C_{10}$ perfluoroalkane sulfonates such as trifluoro methane sulfonate, perfluoro butane sulfonate and perfluoro octane sulfonate, $C_1$-$C_{18}$ linear, branched and alicyclic alkane sulfonates, such as dodecane sulfonate, methane sulfonate and camphor sulfonate, $C_1$-$C_{18}$ aromatic and substituted aromatic sulfonates such as toluene sulfonate and dodecylbenzene sulfonate, $C_1$-$C_{18}$ fluorinated aryl sulfonates, such as the trifluoromethyl benzene sulfonates, pentafluoro benzene sulfonate and the like, $C_1$-$C_{18}$ carboxylates and halogenated carboxylates such as benzoate, acetate, chloroacetate, dichloroacetate, trichloroacetate, trifluoroacetate, perfluoropentanoate, pentafluoropropanoate, perfluorooctanoate, perfluorobenzoate, and the like. Further, without limitation, suitable anions include $C_1$-$C_{20}$ tris (alkane sulfonyl)methanides, tris (fluoralkane sulfonyl)methanides, ($R_3C^-$), bis (alkane sulfonyl) imides, and bis (fluoroalkane sulfonyl) imides, ($R_2N^-$), such as tris(trifluoromethylsulfonyl)methanide, bis(trifluoromethylsulfonyl)imide and the like. Further, without limitation, oxo-acid anions can be bound to polymers so that acid diffusion out of the hard-mask material can be limited. Among these are polymeric acids such as poly(vinyl sulfonate), poly(styrene-4-sulfonate), poly(tetrafluoroethylene-co-1,1,2,2-tetrafluoro-2-(1,2,2-trifluorovinyloxy)ethanesulfonate), poly((meth)acrylic acid) and the like. In addition, sulfonated and fluorosulfonated (meth)acrylic monomers may be incorporated into a variety of polymers. It will be appreciated that oxo-acid anions may comprise other elements such as Se, P, As, Sb to form selenonates, phosphonates, arsenonates, stibonates and the like. Thermal acid generators of the ester type may comprise, for example, any of the foregoing oxo-acid anions to form carboxylate, sulfonate, selenonate, phosphonate, arsenonate, and stibononate esters.

Further, without limitation, the ester-type and onium type thermal acid generators may be used as photoacid generators at wavelengths in which they absorb electromagnetic radiation of can act as electron acceptors from other components of the hard-mask composition. In addition, triazine-type photoacid generators may be used. Suitable halogenated triazines include halomethyl-s-triazines. Suitable halogenated triazines include for example, 2-[1-(3,4-benzodioxolyl)]-4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furfylethylidene)-4,6-bis(trichloromethyl)1,3,5-triazine, 2-[2-(5-methylfuryl)ethylidene]-4,6-bis(trichloromethyl)-1,3,5-triazine, 2-[2-(4-methylfuryl)ethylidene]-4,6-bis(trichloromethyl)-1,3,5-triazine, 2-[2-(3-methylfuryl)ethylidine]-4,6-bis-(trichloromethyl)-1,3,5-triazine, 2-[2-(4,5-dimethylfuryl)ethylidene]-4,6-bis(trichloromethyl)-1,3,5-triazine, 2-[2-(5-methoxyfuryl)ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis(trichloromethyl)-1,3,5-triazine, 2-[2-(4,5-dimethoxy-furyl)ethylidene]-4,6-bis(trichloromethyl)-1,3,5-triazine, 2-(2-furfylethylidene)-4,6-bis(tribromomethyl)-1,3,5-triazine, 2-[2-(5-methylfuryl)ethylidene]-4,6-bis(tribromomethyl)-1,3,5-triazine, 2-[2-(4-methylfuryl)-ethylidene]-4,6-bis(tribromomethyl)-1,3,5-triazine, 2-[2-(3-methylfuryl)ethylidene]-4,6-bis (tribromomethyl)-1,3,5-triazine, 2-[2-(4,5-dimethoxyfuryl)ethylidene]-4,6-bis(tribromomethyl)-1,3,5-triazine, 2-[2-(5-methoxyfuryl)ethylidene]-4,6-bis(tribromomethyl)-1,3,5-triazine, 2-[2-(4-methoxyfuryl)ethylidene]-4,6-bis(tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2(3,4,5-trimethoxystyryl)-4,6-bis(trichloromethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., Bulletin of the Chemical Society of Japan, 42, 2924-30 (1969).

In accordance with the subject matter disclosed herein, the total solids in the claimed compositions may suitably comprise 1 g/l to 800 g/l. In accordance with the subject matter disclosed herein total solids in the claimed compositions may further suitably comprise 2.5 g/l to 500 g/l. In accordance with the subject matter disclosed herein total solids in the claimed compositions may still further suitably comprise 5 g/l to 100 g/l.

In accordance with the subject matter disclosed herein, the fullerene loading may suitably comprise 10% to 90% of the total solids in the composition. In accordance with the subject matter disclosed herein, the loading of the crosslinking agent may suitably comprise 90% to 10% of the total solids in the composition. In accordance with the subject matter disclosed herein, the loading of the thermal acid generator may suitably comprise 0% to 40% of the total solids in the composition. In accordance with the subject matter disclosed herein, the photoacid generator may suitably comprise 0% to 40% of the total solids in the composition. All percentages of solids composition are by weight.

Other materials may be present in the composition to enhance film forming characteristics. These include surfactants, wetting agents, rheology modifiers, antifoaming agents and the like.

In accordance with the subject matter disclosed herein, a film formed with any of the described compositions can be heated at a temperature sufficient to cause the crosslinking of the coated film. The presence of a thermal acid generator may lower the temperature at which crosslinking occurs. An exemplary temperature range may be from 80° C. to 350° C.

Another exemplary temperature range may be from 100° C. to 250° C. Still another exemplary temperature range may be from 120° C. to 160° C.

In accordance with the subject matter disclosed herein, a film formed with any of the described compositions can be exposed to electromagnetic radiation at an exposure dose sufficient to cause the crosslinking of the coated film either during heating, before heating or at ambient temperature. The presence of a photoacid generator may lower the temperature at which crosslinking occurs. Exemplary exposure wavelengths may be 190 nm to 520 nm, depending on the sensitivity of the photoacid generator. Further exemplary exposure wavelengths may be 225 nm to 400 nm, depending on the sensitivity of the photoacid generator. An exemplary exposure dose range may be from 0.1 mJ/cm$^2$-1000 mJ/cm$^2$. Another exemplary exposure dose range may be 1 mJ/cm$^2$ to 500 mJ/cm$^2$. Still another exemplary exposure dose range may be 10 mJ/cm$^2$ to 100 mJ/cm$^2$.

Without limitation, coating may suitably be accomplished by spray coating, blade coating, spin coating or combinations thereof. With regard to spin coating, for example, spin speeds may suitably range from 100 rpm to 8000 rpm. As a further example, spin speeds may suitably range from 200 rpm to 5000 rpm. As a still further example, spin speeds may range from 800 rpm to 2000 rpm. Spin times may suitably range from 10 sec to 150 sec. Substrates, coated by any of the above methods may suitably be softbaked before crosslinking. Suitable softbake temperatures may range from 50° C. to 150° C.

The following examples are illustrative and are not intended to limit the scope of the appended claims. For example, various substrates, methods of substrate preparation, etch chemistries and conditions, or resist types and exposure conditions may suitably be used.

EXAMPLES

Substrate Preparation: Silicon (100) substrates (Si-Mat Silicon Materials, n-type) were used for all experimental procedures. Wafers were used as supplied, with no additional cleaning or surface treatment.

Examples 1-4

Details of the compositions of Examples 1-4 are shown in Table 1. Bis-o-QDM $C_{60}$ (Examples 1 and 2) denotes disubstituted C60 fullerene having two exohedral ortho-quinodimethane (5,6-dimethylenecyclohexa-1,3-diene) groups substituted thereon via a [4+2] cycloaddition. The mixed fullerene materials (Examples 3 and 4) employ a blend of fullerenes comprising $C_{60}$, $C_{70}$, and possibly one or more of $C_{76}$, $C_{78}$, $C_{80}$, $C_{82}$, $C_{84}$, $C_{86}$, $C_{90}$, $C_{92}$, $C_{94}$, $C_{96}$, or $C_{98}$ onto which one or more o-QDM units have been substituted by [4+2] cycloaddition. Such formulations are also denoted as "mixed multi" systems. The crosslinker, poly[(o-cresyl glycidyi ether)-co-formaldehyde], is available from Huntsman International LLC of Derry, N.H. In a typical formulation exercise, the solids are allowed to dissolve in the listed solvent. The resulting solution may be filtered through a 0.01-1.0 μm filter into a clean glass or plastic container before use. Further, the resulting solution may be filtered through a 0.02-0.2 μm filter into a container as above. Filters may be of the absolute or nominal type or combinations thereof. Filters may comprise pores, channels, percolative pathways, or the equivalent or combinations thereof. Containers may be metal-ion free materials or materials designed to limit diffusion of contaminant ions into the solution.

TABLE 1

Examples 1-4

Figure 5:
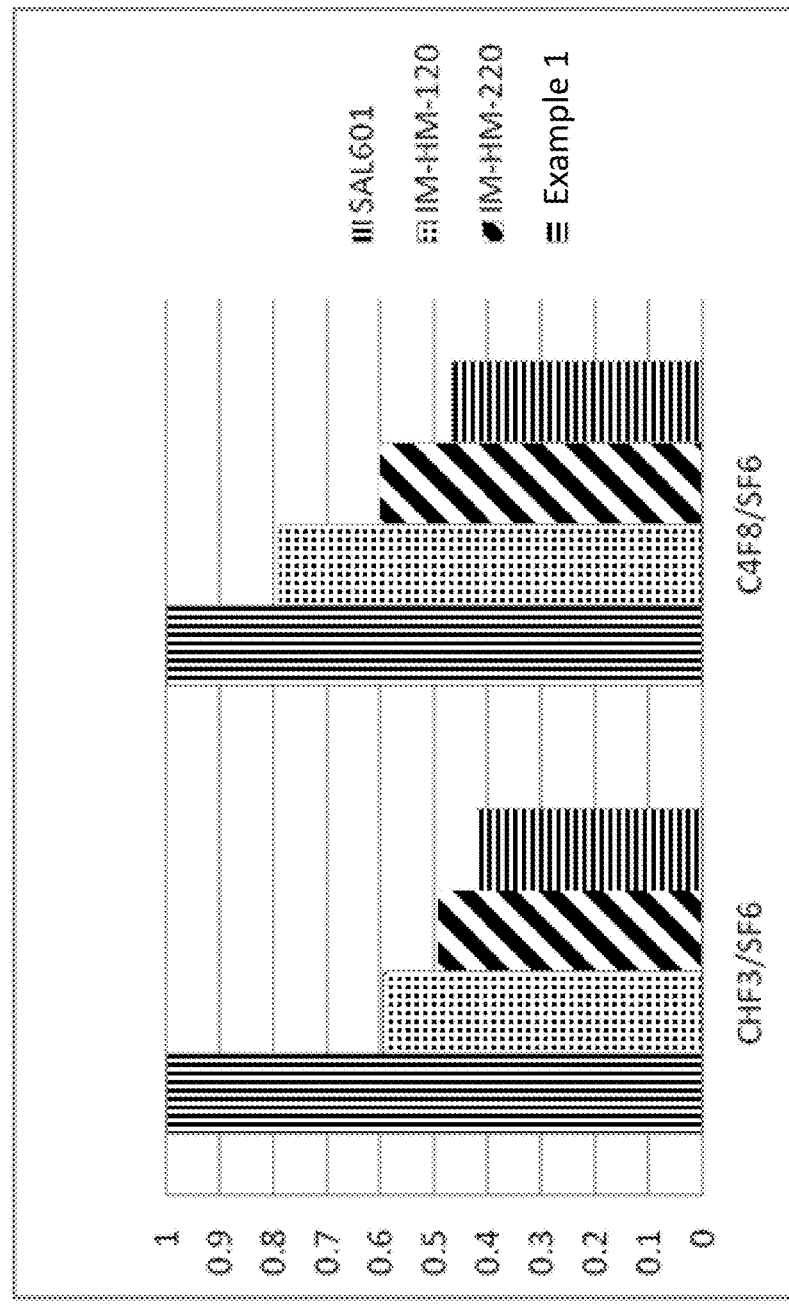
FIG. 5 illustrates the etching resistance of a film made with the formulation of Example 1, relative to several known materials.
Figure 6:
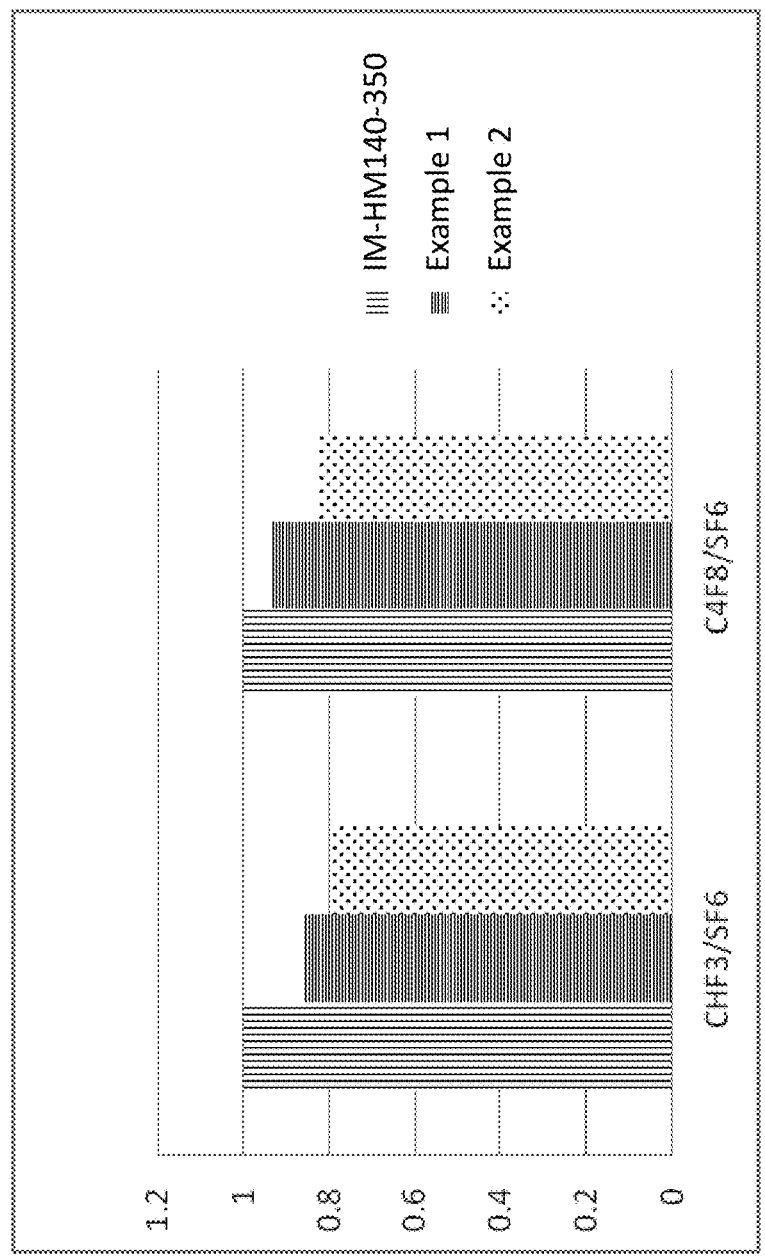
FIG. 6 illustrates the etching resistance of films made with the formulations of Example 1 and Example 2, relative to a known material.
Figure 7:
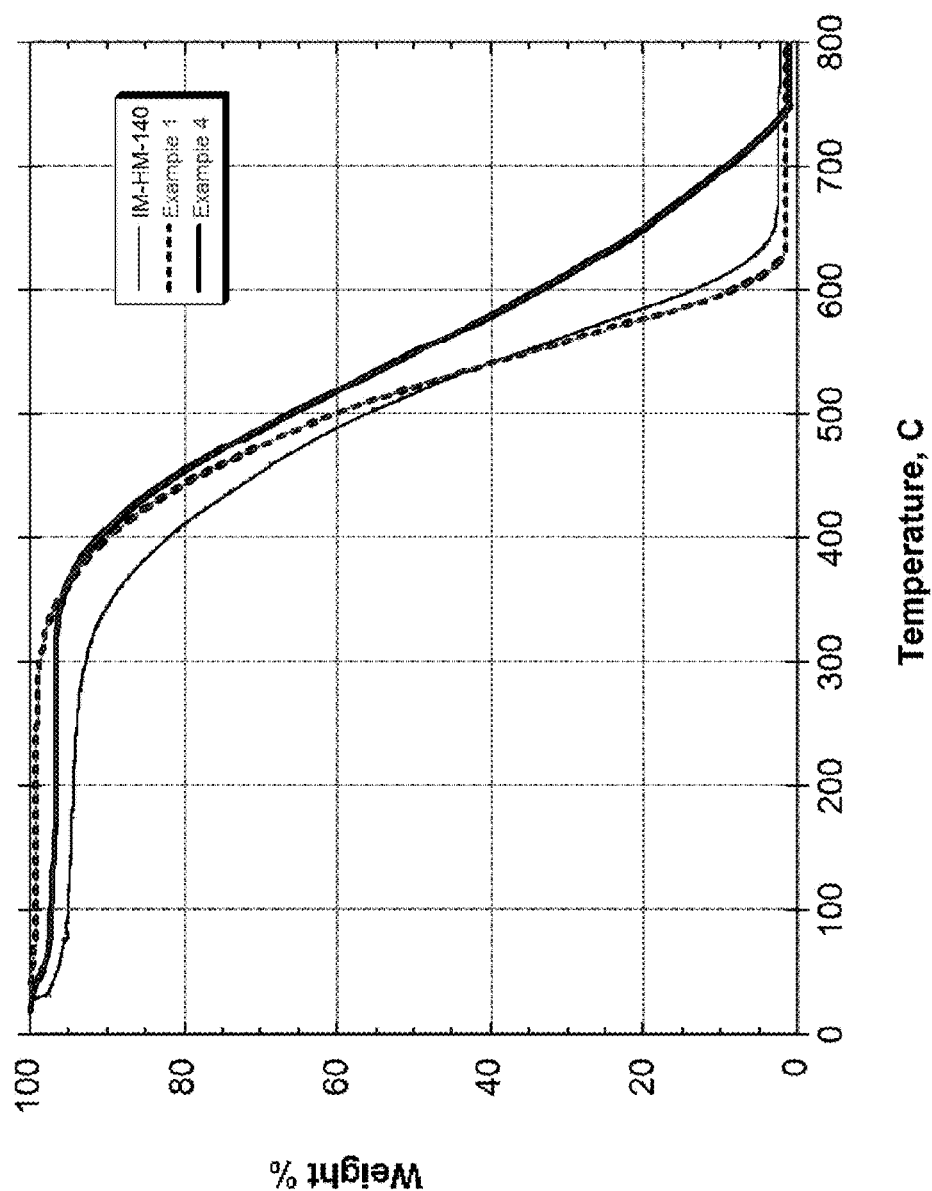
FIG. 7 illustrates exemplary results from thermo-gravimetric analysis of hard-mask films described herein along with a previously known material.

| Example | Fullerene, % solids | Crosslinker, % solids | Percent Total Solids | Thickness, nm 1000 rpm/60 s 350° C./ 5 min | Results of film loss vs. bake temperature. | Results of etching rates, described herein | Results of Thermo-gravimetric analysis, described herein |
|---|---|---|---|---|---|---|---|
| 1 | bis-o-QDM $C_{60}$, 50% 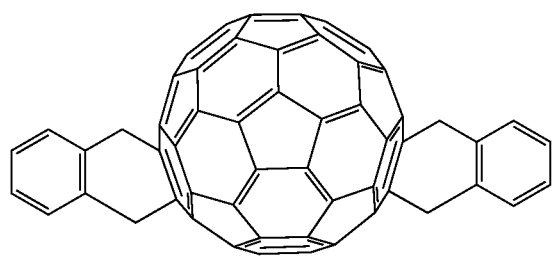 [SMILES: c1ccc2c(c1)Cc1c(c3c4ccc5c6c7c(c8c9ccc%10c%11ccc%12c1c1c3c3c4c5c4c6c8c5c9c%10c6c%11c%12c1c1c6c5c4c31)Cc1ccccc1C7)C2] | 50% Poly[(o-cresyl glycidyl ether)-co-formaldehyde] | 5% (50 g/l) in cyclohexanone | 140 | FIG. 1 | FIGS. 5-6 | FIG. 7 |

TABLE 1-continued

Examples 1-4

Figure 2:
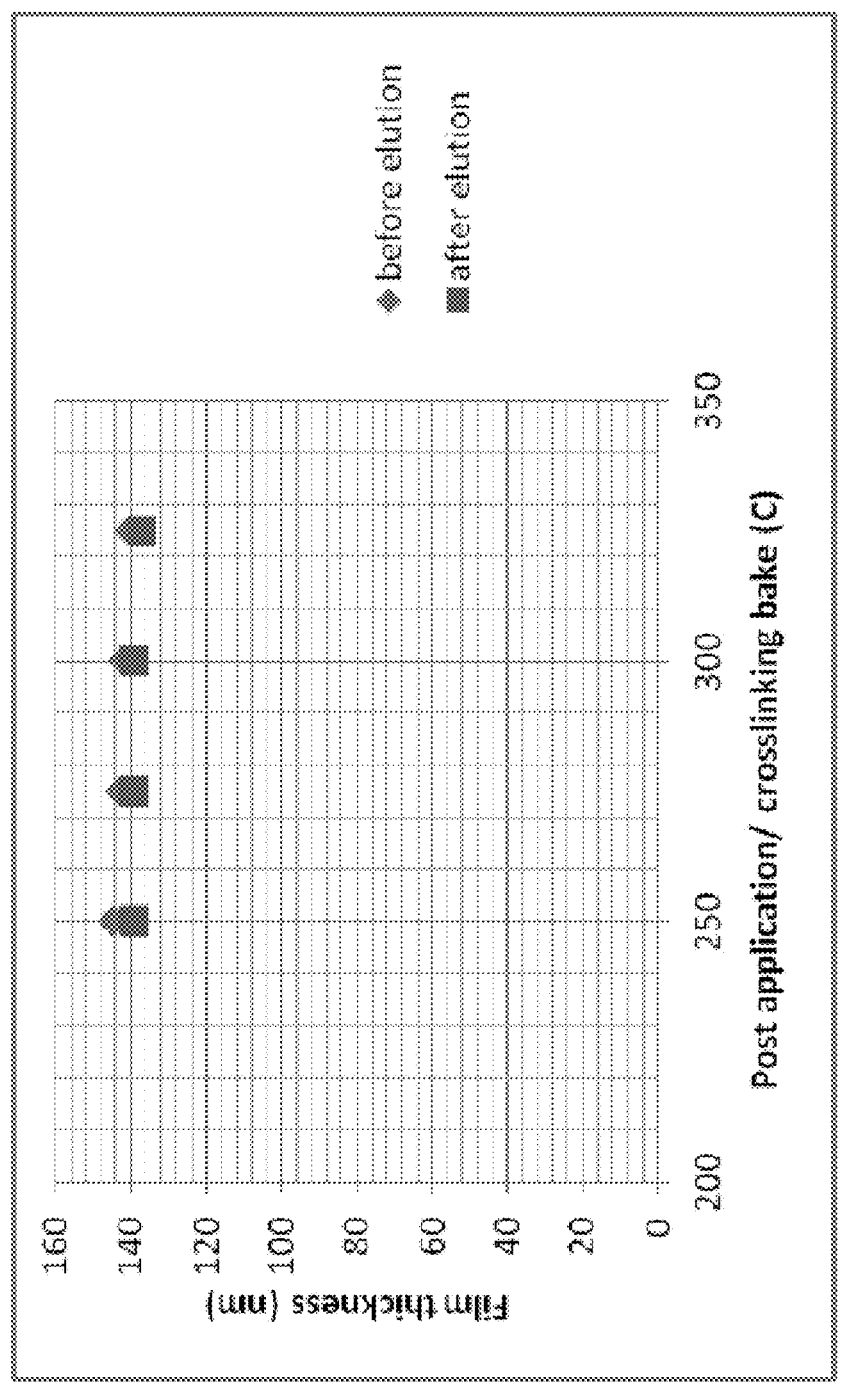
FIG. 2 illustrates film thickness retention after treatment with chlorobenzene for the formulation of Example 2.
Figure 3:
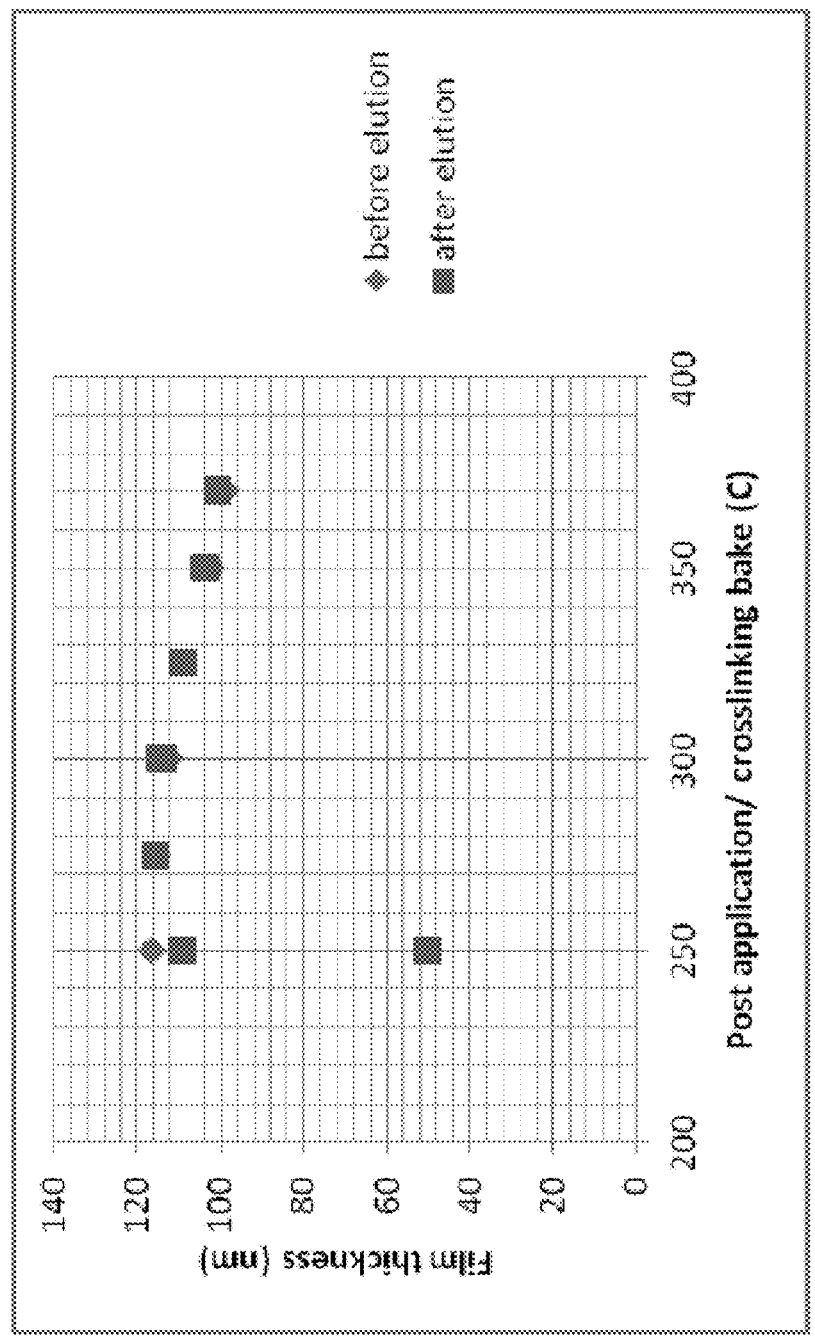
FIG. 3 illustrates film thickness retention after treatment with chlorobenzene for the formulation of Example 3.
Figure 4:
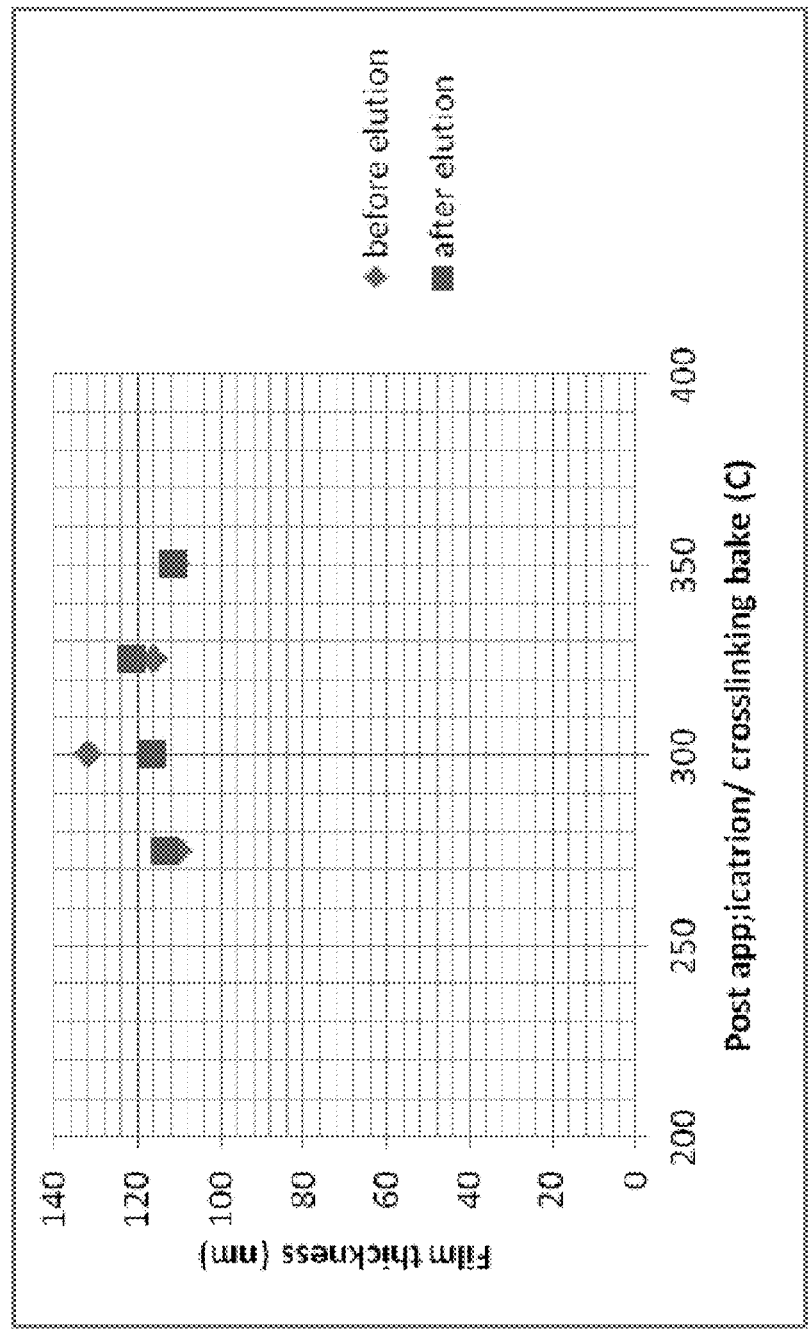
FIG. 4 illustrates film thickness retention after treatment with chlorobenzene for the formulation of Example 4.

| Example | Fullerene, % solids | Crosslinker, % solids | Percent Total Solids | Thickness, nm 1000 rpm/60 s 350° C./ 5 min | Results of film loss vs. bake temperature. | Results of etching rates, described herein | Results of Thermogravimetric analysis, described herein |
|---|---|---|---|---|---|---|---|
| 2 | bis-oQDM C$_{60}$, 56.5% (structure shown) | 43.5% Poly[(o-cresyl glycidyl ether)-co-formaldehyde] | 5% (50 g/l) in cyclohexanone | 140 | FIG. 2 | FIG. 6 | — |
| 3 | Mixed fullerene, multi o-QDM, 50% | 50% Poly[(o-cresyl glycidyl ether)-co-formaldehyde] | 5% (50 g/l) in anisole | 110 | FIG. 3 | — | — |
| 4 | Mixed fullerene, multio-QDM, 83.3% | 16.7% Poly[(o-cresyl glycidyl ether)-co-formaldehyde] | 5% (50 g/l) in anisole | 110 | FIG. 4 | — | FIG. 7 |

Films of the hard-mask were prepared by spin coating on the above described substrates at a spin speed of 1000 rpm for 60 seconds. After spin coating the films were baked for 5 minutes at a set point of 350° C. unless otherwise noted. The resulting film thicknesses are as listed above. Thicknesses were measured using a Horiba Scientific UVISEL-1 spectroscopic ellipsometer.

In order to enable further processing, the spin-on hard-mask should be rendered insoluble in typical photoresist solvents to avoid comingling of the resist and hard-mask layers. FIGS. 1-4 illustrate the retained thickness after solvent wash with chlorobenzene for one min as a function of curing temperature.

FIG. 1 illustrates film thickness retention after treatment with chlorobenzene for the formulation of Example 1. Curing occurred at 235°, 250°, 265°, and 280° C. for 5 min as shown. As can be seen, the film is virtually dissolved for the sample baked at 235° C. The film exhibited low solubility when baked at a set point temperature of 250° C. and above.

FIG. 2 illustrates film thickness retention after treatment with chlorobenzene for the formulation of Example 2. Curing occurred at 250°, 275°, 300°, and 325° for 5 min as shown. As can be seen, the film exhibited low solubility when baked at a set point temperature of 250° C. and above.

FIG. 3 illustrates film thickness retention after treatment with chlorobenzene for the formulation of Example 3. Curing occurred at 250°, 275°, 300°, 325°, 350°, and 370° C. for 5 min as shown. As can be seen, the film exhibited low solubility when baked at a set point temperature of 250° C. and above.

FIG. 4 illustrates film thickness retention after treatment with chlorobenzene for the formulation of Example 4. Curing occurred at 275°, 300°, 325°, and 350° C. for 5 min as shown. As can be seen, the film exhibited low solubility when baked at a set point temperature of 275° C. and above.

Reactive Ion Etching Results. The unpatterned films were then blanket etched using an Oxford Instruments PlasmaPro NGP80 Inductively Coupled Plasma (ICP) system. Silicon substrates wafers were mechanically clamped to the lower electrode, equipped with helium backside pressure to ensure good thermal control of the sample during the etching process. The films were etched using typical silicon plasma etch conditions, (a) mixed mode $SF_6/C_4F_8$ plasma etch conditions were: $SF_6$ flow rate of 20 sccm; $C_4F_8$ flow rate of 30 sccm; RF power of 20 W; and ICP power of 220 W; 15 mTorr chamber pressure; 10 Torr Helium backing; and stage temperature 5° C. and (b) mixed mode $SF_6/CHF_3$ plasma conditions were: $SF_6$ flow rate of 15 sccm; $CHF_3$ flow rate of 50 sccm; RF power of 20 W; and a ICP power of 200 W; 20 mTorr chamber pressure; 10 Torr Helium backing and stage temperature 5° C.

FIG. 5 shows the normalized etching rate of a film made with the formulation of Example 1 with respect to SAL 601™, a standard electron-beam resist available from the Dow Electronic Materials Company. Also shown, for comparison, are IM-HM-120 and IM-HM-220, based on methanofullerene chemistry with Poly[(o-cresyl glycidyl ether)-co-formaldehyde] and 4,4 2-(9 Fluorenylidene) dianiline, respectively, available from Irresistible Materials Company. As can be seen, the formulation of Example 1 exhibits the slowest etching rate among the four samples tested.

FIG. 6 illustrates the results of a similar etching experiment using films made using the formulations of Example 1 and Example 2, normalized against IM-HM140-350, a mixed fullerene multiply substituted methanofullerene with Poly[(o-cresyl glycidyl ether)-co-formaldehyde] as the crosslinker, available from Irresistible Materials Company. The materials of the current application show significantly slower etching resistance than that exhibited by the previous material. In addition, the higher fullerene content of the film made with Example 2 contributes further to etch resistance.

FIG. 7 illustrates exemplary results of thermo-gravimetric analysis of films made with the formulations of Example 1 and Example 4, as well as IM-HM140-350, available from Irresistible Materials Company. Measurements were performed on a Navas Instruments TGA-1000 thermogravimetric analyzer using a temperature ramp rate of 10° C./min. Prior to analysis, the films were baked at 300° C. for 5 min. As shown in FIG. 7, the films made with the formulations of Example 1 and Example 4 exhibited improved temperature performance over the IM-HM140-350.

Although the present invention has been shown and described with reference to particular examples, various changes and modifications which are obvious to persons skilled in the art to which the invention pertains are deemed to lie within the spirit, scope and contemplation of the subject matter set forth in the appended claims.

What is claimed is:

1. A hardmask composition, comprising one or more fullerene derivatives having one or more exohedral rings expressed by the formula:

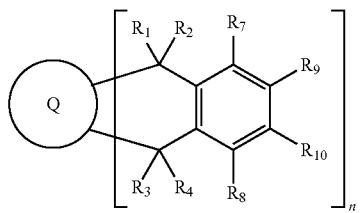

wherein n is an integer from 1 to 12, Q is a fullerene having 60, 70, 76, 78, 80, 82, 84, 86, 90, 92, 94, or 96 carbon atoms, wherein $R_1$ through $R_{10}$ are each different or one or more are the same comprising an ester, an alcohol, a phenol, an amide, an imide, a carboxylic acid, a hydrogen, a halogen, a $C_6$-$C_{20}$ aryl group, or a $C_1$-$C_{20}$ alkyl group and further comprising a crosslinking agent comprising two or more thermally or catalytically reactive groups.

2. The hardmask composition of claim 1, wherein $R_9$ and $R_{10}$ together comprise a non-bridged, exohedral ring structure.

3. The hardmask composition of claim 1, wherein the one or more exohedral rings contain a heteroatom in the ring.

4. The hardmask composition of claim 1, wherein the crosslinking agent is chosen from 4,4'-(9H-fluorene-9,9-diyl)-dianiline, an epoxy phenolic novolac resin, an epoxy cresylic novolac resin, an epoxy bisphenol A resin, an epoxy bisphenol A novolac resin, an epoxy bisphenol C resin, an alkylolmethyl melamine resin, an alkylolmethyl glycoluril resin, an alkylolmethyl guanamine resin, an alkylolmethyl benzoguanamine resin, a glycosyl urea resin, or an alkyd resin.

5. The hardmask composition of claim 1, further comprising one or more thermal acid generators, wherein the one or more thermal acid generators are chosen from alkyl esters of organic sulfonic acids, alicyclic esters of organic sulfonic acids, amine salts of organic sulfonic acids, 2-nitrobenzyl esters of organic sulfonic acids, 4-nitrobenzyl esters of organic sulfonic acids, benzoin esters of organic sulfonic acids, β-hydroxyalkyl esters of organic sulfonic acids, β-hydroxycycloalkyl esters of organic sulfonic acids, triaryl sulfonium salts of organic sulfonic acids, alkyl diaryl sulfonium salts of organic sulfonic acids, dialkyl aryl sulfonium salts of organic sulfonic acids, trialkyl sulfonium salts of organic sulfonic acids, diaryl iodonium salts of organic sulfonic acids, alkyl aryl sulfonium salts of organic sulfonic acids, or ammonium salts of tris(organosulfonyl) methides.

6. The hardmask composition of claim 1, wherein the one or more fullerene derivatives comprises a blend, said blend comprising species wherein Q=60, and Q=70, and n=2 to 8.

7. The hardmask composition of claim 1, wherein the crosslinking agent comprises poly[(o-cresyl glycidyl ether)-co-formaldehyde].

8. The hardmask composition of claim 1, further comprising one or more solvents chosen from polyethylene glycol monomethyl ether acetate, ethyl lactate, anisole, cyclohexanone, toluene, chloroform, chlorobenzene, o-dichlorobenzene, m-dichlorobenzene, p-dichlorobenzene, o-xylene, m-xylene, p-xylene, carbon disulfide, 1-chloronaphthalene, 1-methylnaphthalene, 1,2,4-trimethylbenzene, tetrahydronaphthalene, 1,2,3-tribromopropane, bromoform, cumene, benzene, carbon tetrachloride, n-hexane, cyclohexane, tetrahydrofuran, acetonitrile, methanol, water, pentane, heptane, octane, isooctane, decane, dodecane, tetradecane, acetone, isopropanol, dioxane, mesitylene, dichloromethane, or a mixture comprising any of the foregoing.

* * * * *